United States Patent [19]

Miyazawa et al.

[11] Patent Number: 4,528,061
[45] Date of Patent: Jul. 9, 1985

[54] PROCESS FOR MANUFACTURING BORON-DOPED GALLIUM ARSENIDE SINGLE CRYSTAL

[75] Inventors: Shintaro Miyazawa; Yasushi Nanishi, both of Kanagawa; Kohji Tada, Osaka; Akihisa Kawasaki, Osaka; Toshihiro Kotani, Osaka, all of Japan

[73] Assignees: Nippon Telegraph & Telephone Public Corporation, Tokyo; Sumitomo Electric Industries, Ltd., Osaka, both of Japan

[21] Appl. No.: 485,355

[22] Filed: Apr. 15, 1983

[30] Foreign Application Priority Data

Apr. 16, 1982 [JP] Japan .................................. 57-64508

[51] Int. Cl.³ ............................................. C30B 15/04
[52] U.S. Cl. ................................... 156/605; 156/607; 156/617 SP; 156/DIG. 70
[58] Field of Search ......... 156/607, 617 SP, DIG. 70, 156/DIG. 81, DIG. 86, 605

[56] References Cited

U.S. PATENT DOCUMENTS 4,200,621 4/1980 Liaw et al. .................... 156/617 SP 4,303,464 12/1981 Suzuki et al. .................. 156/607 X

FOREIGN PATENT DOCUMENTS 2133875 1/1973 Fed. Rep. of Germany ...... 156/607

OTHER PUBLICATIONS

AuCoin et al.; Liquid Encapsulated Compounding and Czochralski Growth of Semi-Insulating GaAs; Solid State Tech.; Jan. '79, pp. 59-62 & 67.

Primary Examiner—Hiram H. Bernstein
Assistant Examiner—Michael S. Gzybowski
Attorney, Agent, or Firm—Sughrue, Mion, Zinn, Macpeak & Seas

[57] ABSTRACT

A process for manufacturing boron-doped GaAs single crystals which comprises preparing a mixture of boron, gallium and arsenic covered by a liquid $B_2O_3$ encapsulant, melting the mixture, pulling up boron-doped GaAs crystals from the mixture melts in accordance with the LEC method, crushing those crystals into small pieces after removing the seed end therefrom, remelting those pieces in the presence of $B_2O_3$, and pulling up single crystals from the mixture melts in accordance with the LEC method.

7 Claims, 4 Drawing Figures

SCHEMACTIC PICTURE OF THE LEC METHOD

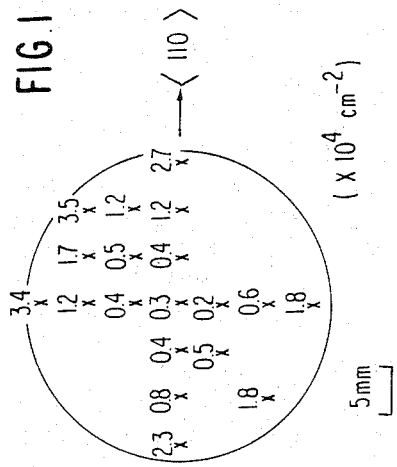
FIG. 1
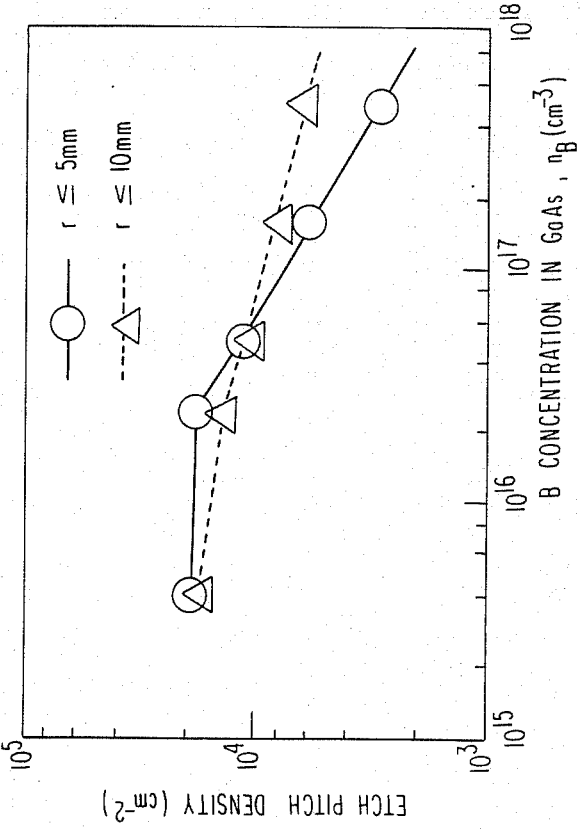
FIG. 2
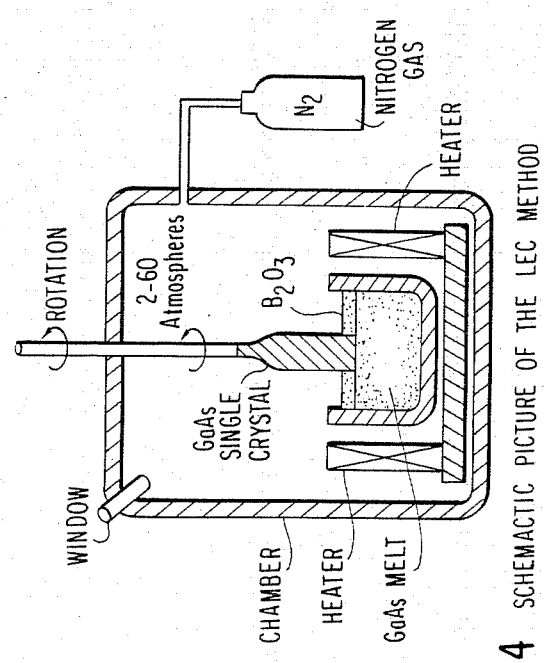
FIG. 3
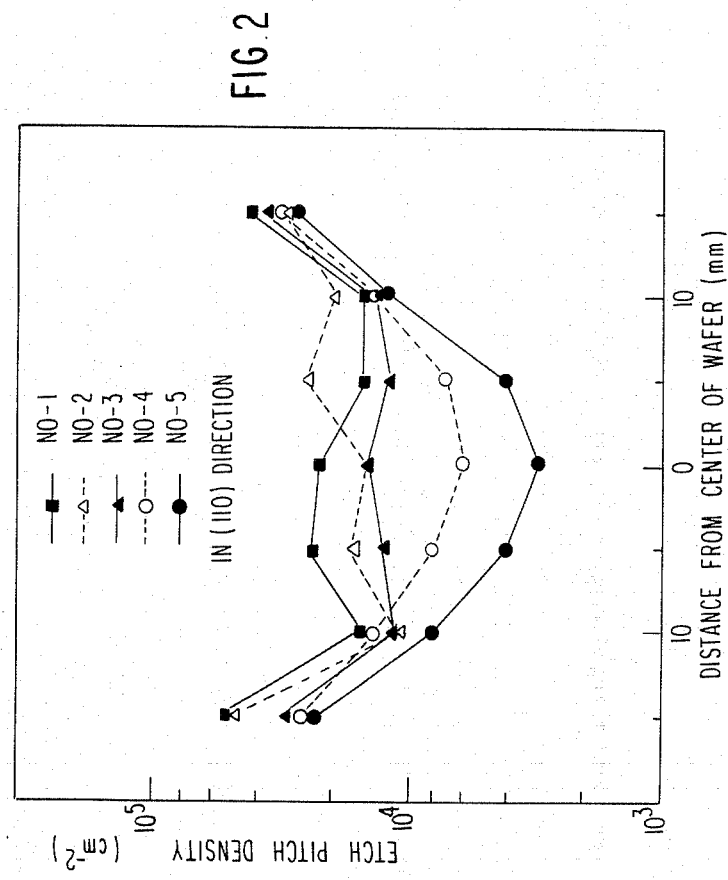
FIG. 4 SCHEMATIC PICTURE OF THE LEC METHOD

PROCESS FOR MANUFACTURING BORON-DOPED GALLIUM ARSENIDE SINGLE CRYSTAL

BACKGROUND OF THE INVENTION

1. Field of the Invention

This invention relates to a process for manufacturing boron-doped GaAs single crystals of low dislocation density which are suitable for preparing a stable semi-insulating substrate.

2. Description of the Prior Art

Single crystals of gallium arsenide (GaAs) have come to be used over an increasing range of optoelectronic applications, including the manufacture of semiconductor lasers and GaAs IC's. It is, however, difficult to obtain large GaAs single crystals with low dislocation density, as opposed to silicon. Therefore, the doping of GaAs single crystals with boron has been proposed to provide GaAs single crystals of low dislocation density, as disclosed in Japanese patent application No. 148335/1981.

The recent development of direct synthesis methods and the LEC (Liquid Encapsulated Czochralski) method employing a boron nitride crucible have led to an extensive research for methods of preparing single crystals of undoped semi-insulating gallium arsenide, which is a compound semiconductor. A semi-insulating substance is generally meant as a substance having a resistivity between $10^6$ and $10^9$ $\Omega$ cm.

The single crystals of GaAs of high purity produced by the LEC method are commercially available in the form of <100> wafers having a diameter of two or three inches. The gallium arsenide produced by the LEC method has, however, a dislocation density of $10^4$ to $10^5$ cm$^{-2}$ which is 10 to 100 times higher than that of GaAs obtained by the HB (Horizontal Bridgman) method. Since the effects which dislocation may have on the yield and stability of IC devices employing semi-insulating GaAs have been recently clarified, it is essential to use GaAs crystals of low dislocation density in order to obtain devices of higher stability. The electrical property with dislocations is different from that without dislocations, because the impurities are gettering at the neighborhood of the dislocations.

It is well known that (a) a low temperature gradient near the solid-liquid interface, (b) a horizontally flat or convex solid-liquid interface, and (c) necking-in technique are important to obtain GaAs crystals of low dislocation density. It is, however, very difficult to satisfy these requirements.

There is a report indicating that it is relatively easy to obtain GaAs of low dislocation density when it is doped with S or Te (Yasuo Seki et al., J. Appl. Phys., 49 (1978), p. 822 ff.), but semi-insulating GaAs can not be obtained by doping with S or Te. It is theoretically possible to expect a low dislocation density by doping GaAs with boron. According to the single-bond strength model proposed by Yasuo Seki et al., the bond energy between B and As is 72.9 kcal/mol and higher than that between Ga and As in the matrix (47.7 kcal/mol), and which ensures greater resistance to dislocation, since boron atoms resist dislocation, and they are considered to be electrically neutral in GaAs.

It has hitherto been conventional to melt a mixture of GaAs and BAs to produce boron-doped GaAs single cystals. Boron arsenide is, however, difficult to obtain and expensive, though boron is easy to obtain and is inexpensive. It is easier to obtain a prescribed quantity of boron in boron-doped single-crystal GaAs by mixing GaAs doped with a different quantity of boron, than by employing a specific quantity of BAs relative to GaAs. Boron is difficult to dissolve in GaAs, which presents a substantial problem with adding boron in a large quantity to GaAs.

SUMMARY OF THE INVENTION

It is an object of this invention to provide a novel and improved process which eliminates the drawbacks and difficulties involved in the art of manufacture of boron-doped GaAs single crystals which enables the production of boron-doped GaAs single crystals of low dislocation density from boron, gallium and arsenic.

According to this invention, boron, gallium and arsenic are used as the starting materials, and the LEC method is repeated. If the pulled crystal is a poly-crystal, the LEC method repeats further.

This invention enables one to produce boron-doped GaAs single crystals containing a large quantity of boron in a relatively short time (for example, about one day) with accurate control of boron content. The boron content in the crystal is higher than $10^{17}$ cm$^{-3}$. According to this invention, therefore, it is easy to produce semi-insulating GaAs single crystals of low dislocation density less than about $10^4$ cm$^{-2}$.

BRIEF DESCRIPTION OF THE DRAWINGS

FIG. 1 shows the EPD (etch pit density) distribution in a cross section of a boron-doped GaAs single crystal.

FIG. 2 shows the EPD distribution in the <110> direction of a boron-doped GaAs single crystal.

FIG. 3 shows the raltionship between the concentration of boron in a boron-doped GaAs single crystal and the average etch pit density (EPD).

FIG. 4 shows a schematic picture of the LEC method.

DETAILED DESCRIPTION OF THE INVENTION

A mixture of boron, gallium and arsenic is coated with a liquid encapsulant ($B_2O_3$), and melted. The boron content in the mixture of B, Ga and As is higher than 28.3 wt. ppm. The mole-fraction of As is higher than that of Ga, for example, 1.01-1.05 times that of Ga. Then, boron-doped GaAs crystals are pulled up from the mixture melts by the LEC method. The seed end is removed from the crystal, and small pieces are formed from the grown crystal. The size of a piece is a cube of about 1 cm. The small pieces are remelted in the presence of the liquid encapsulant $B_2O_3$, with boron if required, and a boron-doped GaAs single crystal is pulled up by the LEC method. The additional B content is less than 50 wt. ppm. It is necessary to use B, Ga, As and $B_2O_3$ which are of the highest possible purity and a crucible which is substantially free from any impurities, for example, artificial boron nitride. Except B, the impurity concentrations is less than $10^{16}$ cm$^{-3}$. It is, of course, necessary to apply to the exterior of the liquid encapsulant a pressure which is higher than the vapor pressure of the melts of GaAs. The pressure is higher than about 50 kg/cm$^2$. A higher pulling-up speed (for example, from 10 to 25 mm/hr) can be employed in the event, polycrystals may be pulled up directly. For both of the melting and remelting, the temperature is about 1,238° C., and the time is from 2 to 3 hours, respectively.

For the melting, the pressure is higher than 50 kg/cm$^2$, and for the remelting, the pressure is higher than 2 kg/cm$^2$.

The LEC technique is schematically indicated in FIG. 4. In this technique, GaAs melt is coated with a liquid encapsulant ($B_2O_3$), and the GaAs crystal is pulled up under high pressure of 2-60 kg/cm$^2$ after the seed is attached to the melt.

This invention can also be carried out by employing a dopant other than boron, for example, aluminum.

The invention will now be further described by way of example.

Both the Ga and As which were used as the starting materials were of the 6-nine grade (99.9999%) in purity. Two different $B_2O_3$ encapsulants of the 5-nine grade (99.999%) which contained water of 300 ppm and 600 ppm were used. Boron shots (grains) having a diameter of 1 to 2 mm were used as the dopant.

The primary boron-doped crystals were formed by direct synthesis method. Gallium, arsenic and boron were placed in a boron nitride crucible having a diameter of three inches, and $B_2O_3$ was placed so as to cover the materials. They were melted by heating to about 800° C. in the atmosphere of nitrogen gas having a pressure of 50 to 70 atms.

The crystal was pulled up under the following conditions by the LEC method employing resistance heating, whereby a polycrystal body having a diameter of 38 mm was prepared (this diameter is not limitative, of course):

Pulling Conditions

Nitrogen gas pressure: 15 kg/cm$^2$
Pulling rate: 15 mm/hr
Rotation rate of crystal: 7 rpm
Rotation rate of crucible: 8 rpm
$B_2O_3$ thickness: 17 mm
Temperature gradient in $B_2O_3$: 200° C./cm
Melt temperature: 1,238° C.

The seed end containing particulate undissolved boron was removed from the polycrystalline body. The remaining polycrystalline body was crushed into small pieces measuring about 10 mm square, and these pieces were washed with aqua regia for about 10 minutes. The small pieces were remelted in the boron nitride crucible in the presence of $B_2O_3$ (with boron if required), and the melt was pulled up in the <100> direction under the following conditions by the LEC method employing resistance heating:

Pulling Conditions

Nitrogen gas pressure: 15 kg/cm$^2$
Pulling rate: 7 mm/hr
Rotation rate of crystal: 7 rpm
Rotation rate of crucible: 8 rpm
$B_2O_3$ thickness: 17 mm
Temperature gradient in $B_2O_3$: 150° C./cm
Melt temperature: 1,236° C.

The single crystal thus pulled up was 36 mm in diameter, 70 mm in length and 350 g in weight. These dimensions are not limitative, of course.

Several samples of boron-doped and undoped GaAs single crystals were prepared by the process as above described, and their properties were examined.

(1) Samples

The samples thus prepared are shown under Nos. 1 to 5 in TABLE 1. The single crystals were directly synthesized, and continuously pulled up at a pulling rate of from 5 to 20 mm. Sample Nos. 1 and 3 were both undoped, but prepared by employing $B_2O_3$ encapsulants which differed in containing water of 600 ppm and 300 ppm, respectively. Sample No. 2 was doped with boron. Sample Nos. 4 and 5 were prepared by incorporating a large quantity of boron which is higher than $10^{17}$ cm$^{-3}$ during direct synthesis, pulling polycrystals due to the presence of fine particles of undissolved boron, and then pulling single crystals from the polycrystals. Additional boron was incorporated for preparing Sample No. 5.

TABLE 1

| | Growth of Boron-Doped GaAs Crystals | | | | |
|---|---|---|---|---|---|
| Sample No. | 1 | 2 | 3 | 4 | 5 |
| Starting materials | Ga and As (a) | Ga and As (a) | Ga and As (a) | GaAs polycrystals (b) | GaAs polycrystals (c) |
| Doping | Undoped | Boron (6.3 wt. ppm) | Undoped | Undoped | Boron (22.0 wt. ppm) |
| Water content of $B_2O_3$ (wt. ppm) | 600 | 600 | 300 | 300 | 300 |

Notes:
(a) Direct synthesis method using elemental Ga and As.
(b) and (c) GaAs polycrystals grown by the direct synthesis method using elemental boron.
Boron content: (b) 28.3 wt ppm, (c) 284.0 wt ppm.

(2) SSMS Analysis

TABLE 2 shows the results of SSMS (spark source mass spectrometric) analysis of Samples No. 1 to 5, and TABLE 3 shows the results of SSMS analysis of boron-doped polycrystals Nos. 40 and 50 from which Samples No. 4 and 5 were prepared, respectively.

TABLE 2

| Sample No. | 1 | 2 | 3 | 4 | 5 |
|---|---|---|---|---|---|
| B | $4.9 \times 10^{15}$ | $2.4 \times 10^{16}$ | $4.9 \times 10^{16}$ | $1.6 \times 10^{17}$ | $4.9 \times 10^{17}$ |
| Si | $7.2 \times 10^{15}$ | $1.4 \times 10^{16}$ | $2.1 \times 10^{16}$ | $2.1 \times 10^{16}$ | $2.1 \times 10^{16}$ |
| S | $1.4 \times 10^{16}$ | $7.0 \times 10^{15}$ | $1.4 \times 10^{16}$ | $2.1 \times 10^{16}$ | $1.4 \times 10^{16}$ |
| Mg | $5.0 \times 10^{14}$ | $5.0 \times 10^{14}$ | $5.0 \times 10^{14}$ | $5.0 \times 10^{14}$ | $5.0 \times 10^{14}$ |
| Cr | $4.7 \times 10^{14}$ | $1.5 \times 10^{15}$ | $4.7 \times 10^{14}$ | $4.7 \times 10^{14}$ | $4.7 \times 10^{14}$ |
| Mn | $4.0 \times 10^{14}$ | $4.0 \times 10^{14}$ | $4.0 \times 10^{14}$ | $4.0 \times 10^{14}$ | $4.0 \times 10^{14}$ |
| Fe | $4.3 \times 10^{14}$ | $2.1 \times 10^{15}$ | $7.2 \times 10^{14}$ | $7.2 \times 10^{14}$ | $7.2 \times 10^{14}$ |

TABLE 3

| Sample No. | 40 | 50 |
|---|---|---|
| B | $1.6 \times 10^{18}$ | $1.6 \times 10^{18}$ |
| Si | $7.2 \times 10^{15}$ | $7.2 \times 10^{15}$ |
| S | $7.0 \times 10^{15}$ | $4.2 \times 10^{15}$ |
| Mg | $5.0 \times 10^{14}$ | $5.0 \times 10^{14}$ |
| Cr | $7.9 \times 10^{14}$ | $1.5 \times 10^{15}$ |
| Mn | $4.0 \times 10^{14}$ | $4.0 \times 10^{14}$ |
| Fe | $1.5 \times 10^{15}$ | $1.5 \times 10^{15}$ |

The concentration of boron in GaAs showed an increase in the range of $4.9 \times 10^{15}$ to $4.9 \times 10^{17}$ cm$^{-3}$, and such depended on the water content of $B_2O_3$ used as the encapsulant, as the following reaction takes place:

$$2B + 3O \rightleftharpoons B_2O_3.$$

For example, Sample No. 3 grown using $B_2O_3$ having a water content of 300 ppm has a boron content which is 10 times higher than that of Sample No. 1 prepared by using $B_2O_3$ having a water content of 600 ppm.

The following reaction is considered to have a significant bearing on the silicon content:

$$Si + 2O \rightleftharpoons SiO_2.$$

This is obvious from the fact that Sample No. 1 grown using $B_2O_3$ having a water content of 600 ppm had a silicon content of $7.2 \times 10^{15}$ cm$^{-3}$ (which was lower than that of any other sample), while samples Nos. 3 to 5 prepared using $B_2O_3$ having a water content of 300 ppm showed a somewhat higher silicon content of $2.1 \times 10^{16}$ cm$^{-3}$.

The concentrations of other impurities were as follows:

S: $7.0 \times 10^{15}$ to $2.1 \times 10^{16}$ cm$^{-3}$
Cr: $4.7 \times 10^{14}$ to $1.5 \times 10^{15}$ cm$^{-3}$
Fe: $4.3 \times 10^{14}$ to $2.1 \times 10^{15}$ cm$^{-3}$
Mg: $5.0 \times 10^{14}$ cm$^{-3}$
Mn: $4.0 \times 10$ cm$^{-3}$ Sample Nos. 40 and 50 showed a boron concentration which was as high as $1.6 \times 10^{18}$ cm$^{-3}$, and a silicon concentration which was as low as $7.2 \times 10^{15}$ cm$^{-3}$.

(3) Dislocation Density (EPD: Etch Pit Density) and Distribution Thereof

The above samples were examined for EPD (etch pit density). A wafer was sliced from each sample at the shoulder 5 mm above the top of the straight trunk, and had a diameter of about 32 mm. Etching was carried out using molten KOH at 400° C. for 30 minutes, whereby etch pits emerged on the (100) plane.

FIG. 1 shows the EPD distribution in Sample No. 5 having a high boron concentration. The EPD measurement was made on the lattice points at intervals of 5 mm. The dislocation density of the wafer was as low as 3,000 cm$^{-2}$ in its center, and as high as 18,000 to 35,000 cm$^{-2}$ in its periphery.

FIG. 2 shows the EPD distribution in the <110> direction of the wafers. Sample Nos. 4 and 5 having a high boron concentration showed a particularly great reduction in EPD within a distance of 10 mm from the center of the wafer. The distance of 10 mm appears to define a critical point in view of dislocation and thermal stress.

FIG. 3 shows the relation between the boron content of the boron-doped GaAs single crystals and their average etch pit density. In FIG. 3, r indicates the radius from the center of the wafer, and the average EPD for a region within a radius of 5 mm represents the average for five points, while the average EPD for a region within a radius of 10 mm represents the average for 10 points. FIG. 3 shows a lower etch pit density with an increase in the boron concentration. This tendency is particularly great within a radius of 5 mm, this tendency gradually decreases within a radius of 10 mm. It is obvious that a still lower etch pit density can be expected from a boron concentration exceeding $10^{18}$ cm$^{-3}$.

The middle-portion and tail end of the crystal showed a small variation in EPD. This was apparently due to the fact that the thermal stress was so high in the middle-portion and tail end of the crystal that the quantity of boron incorporated was insufficient to achieve any substantial reduction in EPD.

(4) Resistivity and Leakage Current

Resistivity and leakage current are important parameters for the evaluation of GaAs IC's, etc. Since the disordered crystal of a wafer surface can be ordered by annealing, the ion-implanted wafer must be annealed through IC's process. Sample Nos. 1 to 5 showed a resistivity of $5 \times 10^6$ to $5 \times 10^8$ Ω cm. This range of resistivity is quite satisfactory for GaAs IC's.

The leakage current was measured in accordance with the two-probe method by applying a voltage of 1,000 V between the ends of the two probes under room light. The samples were examined for leakage current both before and after annealing which was performed for the capless wafers at 800° C. for 30 minutes in a nitrogen gas atmosphere. The results are shown in TABLE 4.

TABLE 4

| Sample No. | Leakage Current (μA) | |
|---|---|---|
| | Before Annealing | After Annealing |
| 1 | 14.0 | 98.0 |
| 2 | 0.8 | 7.3 |
| 3 | 2.2 | 6.6 |
| 4 | 8.4 | 9.6 |
| 5 | 5.0 | 8.2 |

TABLE 4 indicates that Sample Nos. 4 and 5 having a high boron content do not substantially differ in leakage current from the other samples, but are comparable to them in semi-insulating property and thermal stability, and as useful for the preparation of GaAs IC's.

What is claimed is:

1. A process for manufacturing a boron-doped GaAs single crystal containing a large quantity of boron, comprising:
    preparing a mixture of boron, gallium and arsenic covered by a liquid $B_2O_3$ encapsulant;
    melting the mixture;
    pulling up a boron-doped GaAs body from the melted mixture in accordance with the LEC (Liquid Encapsulated Czochralski) method in which a seed is employed;
    crushing the body into small pieces after removing the seed end therefrom;
    remelting the pieces in the presence of $B_2O_3$; and
    pulling up a single crystal from the remelted pieces in accordance with the LEC method.

2. Process as set forth in claim 1, wherein the body is a polycrystalline body.

3. A process as set forth in claim 1, further including incorporating additional boron when remelting the pieces.

4. A process as set forth in claim 3, wherein the gallium and arsenic are of the 6-nine grade (99.9999%) in purity, and the $B_2O_3$ is of the 5-nine grade (99.999%).

5. A process as set forth in claim 4, wherein the boron is in the form of shots having a diameter of 1 to 2 mm.

6. A process as set forth in claim 4, wherein the $B_2O_3$ has a water content of less than 300 ppm by weight.

7. A process as set forth in claim 4, wherein the $B_2O_3$ has a water content of higher than 600 ppm by weight.

* * * * *